(12) United States Patent
Ka et al.

(10) Patent No.: US 10,304,862 B2
(45) Date of Patent: May 28, 2019

(54) DISPLAY DEVICE CAPABLE OF REDUCING RESISTANCE OF DRIVING VOLTAGE SUPPLY WIRES

(71) Applicant: SAMSUNG DISPLAY CO., LTD., Yongin-si, Gyeonggi-Do (KR)

(72) Inventors: Ji-Hyun Ka, Asan-si (KR); Seung-Kyu Lee, Asan-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 212 days.

(21) Appl. No.: 15/360,443

(22) Filed: Nov. 23, 2016

(65) Prior Publication Data

US 2017/0287937 A1    Oct. 5, 2017

(30) Foreign Application Priority Data

Apr. 5, 2016    (KR) .................... 10-2016-0041555

(51) Int. Cl.
*H01L 27/12*    (2006.01)
*G09G 3/325*    (2016.01)
(Continued)

(52) U.S. Cl.
CPC .......... *H01L 27/124* (2013.01); *G09G 3/325* (2013.01); *G09G 3/3266* (2013.01);
(Continued)

(58) Field of Classification Search
CPC .... H01L 27/124; G09G 3/3291; G09G 3/325; G09G 3/3266; G09G 2300/0809; G09G 2310/0291
See application file for complete search history.

(56) References Cited

U.S. PATENT DOCUMENTS 9,767,767 B2 * 9/2017 Kong .................... G09G 3/3291
2006/0049407 A1 * 3/2006 Jung ........................ H01L 27/12
257/72
(Continued)

FOREIGN PATENT DOCUMENTS

KR    1020140066831    6/2014
KR    1020140072438    6/2014
(Continued)

*Primary Examiner* — Vinh T Lam
(74) *Attorney, Agent, or Firm* — F. Chau & Associates, LLC

(57) ABSTRACT

A display device includes a display panel including a display area and a peripheral area, a plurality of data lines and a plurality of driving voltage lines provided in the display area, a plurality of data connection lines provided in the peripheral area and connected to the plurality of data lines, a first driving voltage transmission line provided in the peripheral area and overlapping the plurality of data connection lines, a second driving voltage transmission line provided in the peripheral area and disposed between the first driving voltage transmission line and the display area, and a plurality of driving voltage connection lines. The plurality of driving voltage connection lines are connected to the first driving voltage transmission line and the second driving voltage transmission line, and provided between the first driving voltage transmission line and the second driving voltage transmission line.

20 Claims, 17 Drawing Sheets

(51) Int. Cl.
  *G09G 3/3266* (2016.01)
  *G09G 3/3291* (2016.01)
  *G09G 3/3225* (2016.01)

(52) U.S. Cl.
  CPC ......... *G09G 3/3291* (2013.01); *G09G 3/3225* (2013.01); *G09G 2300/0426* (2013.01); *G09G 2300/0809* (2013.01); *G09G 2300/0842* (2013.01); *G09G 2310/0291* (2013.01)

(56) References Cited

U.S. PATENT DOCUMENTS

| | | | | |
|---|---|---|---|---|
| 2011/0080173 | A1* | 4/2011 | Kim | G09G 3/006 324/403 |
| 2011/0292008 | A1* | 12/2011 | Iwabuchi | G09G 3/2074 345/204 |
| 2012/0211772 | A1* | 8/2012 | Moh | H01L 27/0288 257/88 |
| 2014/0009714 | A1* | 1/2014 | Shim | G02F 1/1333 349/43 |
| 2014/0111498 | A1* | 4/2014 | Kim | G09G 3/3291 345/212 |
| 2014/0300649 | A1* | 10/2014 | Park | G09G 3/006 345/690 |
| 2015/0049277 | A1* | 2/2015 | Oikawa | H01L 21/02565 349/43 |
| 2015/0123081 | A1* | 5/2015 | Huang | H01L 27/3279 257/40 |
| 2015/0138255 | A1* | 5/2015 | Yamashita | G09G 3/3233 345/690 |
| 2015/0310821 | A1* | 10/2015 | Kim | G09G 3/3677 345/212 |
| 2016/0099260 | A1* | 4/2016 | Chang | H05B 37/00 257/386 |
| 2016/0260381 | A1* | 9/2016 | Gai | G09G 3/3258 |
| 2016/0335955 | A1* | 11/2016 | Cho | G09G 3/3233 |
| 2016/0357041 | A1* | 12/2016 | Jiang | H01L 27/1262 |
| 2017/0018574 | A1* | 1/2017 | Jeong | H01L 27/1237 |
| 2017/0047391 | A1* | 2/2017 | You | H01L 27/3276 |
| 2017/0205676 | A1* | 7/2017 | Li | G02F 1/1368 |

FOREIGN PATENT DOCUMENTS

| | | |
|---|---|---|
| KR | 1020140140419 | 12/2014 |
| KR | 1020150078325 | 7/2015 |

* cited by examiner

DISPLAY DEVICE CAPABLE OF REDUCING RESISTANCE OF DRIVING VOLTAGE SUPPLY WIRES

CROSS-REFERENCE TO RELATED APPLICATION

This application claims priority under 35 U.S.C. § 119 to Korean Patent Application No. 10-2016-0041555, filed in the Korean Intellectual Property Office on Apr. 5, 2016, the disclosure of which is incorporated by reference herein in its entirety.

TECHNICAL FIELD

This disclosure relates to a display device capable of reducing resistance of driving voltage supply wires.

DISCUSSION OF RELATED ART

Examples of display devices include organic light emitting diode (OLED) displays, liquid crystal displays (LCD), field emission displays (FED), and the like. An OLED display device emits light when an electron injected from a cathode and a hole injected from a anode are coupled with each other in an organic emission layer to form an exciton and the exciton discharges energy. Since the OLED display device has a self-luminance characteristic and does not require a separate light source, unlike an LCD, thickness and weight thereof may be reduced.

The OLED display device includes a plurality of pixels in a display area where an image is displayed, and each pixel may include an organic light emitting diode (OLED), a capacitor, a switching transistor, and a driving transistor. A driving voltage is applied to the driving transistor and the capacitor through a driving voltage line. In a peripheral area of the display area, wires are provided to transmit the driving voltage to the driving voltage line. When the length or width of the wires is increased or decreased, current density and voltage drop may also increase or decrease, causing deterioration in luminance uniformity of the image displayed in the display area.

SUMMARY

According to an exemplary embodiment of the inventive concept, a display device includes a display panel including a display area and a peripheral area, a plurality of data lines and a plurality of driving voltage lines provided in the display area, a plurality of data connection lines provided in the peripheral area and connected to the plurality of data lines, a first driving voltage transmission line provided in the peripheral area and overlapping the plurality of data connection lines, a second driving voltage transmission line provided in the peripheral area and disposed between the first driving voltage transmission line and the display area, and a plurality of driving voltage connection lines. The plurality of driving voltage connection lines are connected to the first driving voltage transmission line and the second driving voltage transmission line, and provided between the first driving voltage transmission line and the second driving voltage transmission line.

The first driving voltage transmission line and the second driving voltage transmission line may substantially extend in a first direction, and the plurality of data connection lines and the plurality of driving voltage connection lines may substantially extend in a second direction that crosses the first direction.

The plurality of data connection lines and the plurality of driving voltage connection lines may be alternately arranged one by one along the first direction.

At least two data connection lines among the plurality of data connection lines may be disposed between a pair of driving voltage connection lines among the plurality of driving voltage connection lines. The pair of driving voltage connection lines are adjacent to each other in the first direction.

A line width of each of the driving voltage connection lines may be wider than a line width of each of the data connection lines.

The display device may further include a driving voltage supply line provided in the peripheral area and connected to the first driving voltage transmission line, and a pad portion provided between the first driving voltage transmission line and an edge of the display panel. The driving voltage supply line is connected to the pad portion.

The second driving voltage transmission line and the plurality of data connection lines may overlap each other.

The display device may further include a plurality of gate lines provided in the display area. A portion of the plurality of data connection lines, overlapping the first driving voltage transmission line and the second driving voltage transmission line, may be provided in the same layer as the plurality of gate lines.

The peripheral area may include a bending area, and a portion of the plurality of data connection lines, provided in the bending area, is provided in the same layer as the plurality of driving voltage connection lines.

The first driving voltage transmission line, the second driving voltage transmission line, and the plurality of driving voltage connection lines may be provided in the same layer as the plurality of driving voltage lines.

According to an exemplary embodiment of the inventive concept, a display device includes a display panel including a display area and a peripheral area, a plurality of data lines and a plurality of driving voltage lines provided in the display area, a data driver provided in the peripheral area, a plurality of data connection lines provided in the peripheral area and connecting the data driver and the plurality of data lines, a driving voltage supply line provided in the peripheral area, a first driving voltage transmission line provided between the display area and the data driver and connected with the driving voltage supply line, a second driving voltage transmission line, provided between the display area and the first driving voltage transmission line, in the peripheral area, and a plurality of driving voltage connection lines, connected to the first driving voltage transmission line and the second driving voltage transmission line, in the peripheral area. At least one of the plurality of driving voltage connection lines is provided between the plurality of data connection lines.

The first driving voltage transmission line and the second driving voltage transmission line may substantially extend in a first direction, and the plurality of data connection lines and the plurality of driving voltage connection lines may substantially extend in a second direction that crosses the first direction.

The plurality of data connection lines and the plurality of driving voltage connection lines may be alternately arranged one by one along the first direction.

At least two data connection lines among the plurality of data connection lines may be disposed between a pair of driving voltage connection lines among the plurality of driving voltage connection lines. The pair of driving voltage connection lines are adjacent to each other in the first direction.

A line width of each of the driving voltage connection lines may be wider than a line width of each of the data connection lines.

The display device may further include a pad portion provided between the first driving voltage transmission line and an edge of the display panel in the peripheral area. The driving voltage supply line may be connected to the pad portion.

The plurality of data connection lines may overlap the first driving voltage transmission line and the second driving voltage transmission line.

The display device may further include a plurality of gate lines provided in the display area. A portion of the plurality of data connection lines, overlapping the first driving voltage transmission line and the second driving voltage transmission line, may be provided in the same layer as the plurality of gate lines.

The peripheral area may include a bending area, and a portion of the plurality of data connection lines, provided in the bending area, may be provided in the same layer as the plurality of driving voltage connection lines.

The first driving voltage transmission line, the second driving voltage transmission line, and the plurality of driving voltage connection lines may be provided in the same layer as the plurality of driving voltage lines.

According to an exemplary embodiment of the inventive concept, a display device includes a display panel including a display area and a peripheral area. The display area includes a plurality of pixels and the peripheral area includes a bending area. The display device further includes a plurality of data connection lines extending through the bending area, a first driving voltage transmission line provided in the peripheral area, a second driving voltage transmission line provided in the peripheral area and disposed between the first driving voltage transmission line and the display area, and a plurality of driving voltage connection lines connecting the first driving voltage transmission line and the second driving voltage transmission line, and disposed alongside the plurality of data connection lines. The display device further includes a common voltage supply line, a first common voltage transmission line, a second common voltage transmission line, and a plurality of common voltage connection lines. The common voltage supply line extends through a portion of the peripheral area, substantially surrounds the display area, and supplies a common voltage to the plurality of pixels. The first common voltage transmission line is disposed in the peripheral area, in parallel with the first driving voltage transmission line, and connected to the common voltage supply line. The second common voltage transmission line is disposed in the peripheral area and in parallel with the second driving voltage transmission line. The plurality of common voltage connection lines connects the first common voltage transmission line and the second common voltage transmission line, and is alternatively disposed alongside the plurality of data connection lines.

The display device may further include a plurality of data lines, a plurality of gate lines, and a plurality of driving voltage lines provided in the display area. The plurality of data connection lines is connected to the plurality of data lines. A first and a second portion of the plurality of data connection lines, overlapping the first driving voltage transmission line and the second driving voltage transmission line, respectively, are provided in the same layer as the plurality of gate lines. A third portion of the plurality of data connection lines, provided in the bending area, is provided in the same layer as the plurality of driving voltage connection lines.

A width of the first portion of the plurality of data connection lines or the second portion of the plurality of data connection lines may be greater than a width of the third portion of the plurality of data connection lines.

The first portion of the plurality of data connection lines and the second portion of the plurality of data connection lines may have higher resistivity than the third portion of the plurality of data connection lines.

The first portion of the plurality of data connection lines and the second portion of the plurality of data connection lines may be made of a molybdenum-based metal, and the third portion of the plurality of data connection lines may be made of an aluminum-based metal.

DETAILED DESCRIPTION OF THE EMBODIMENTS

Figure 1:
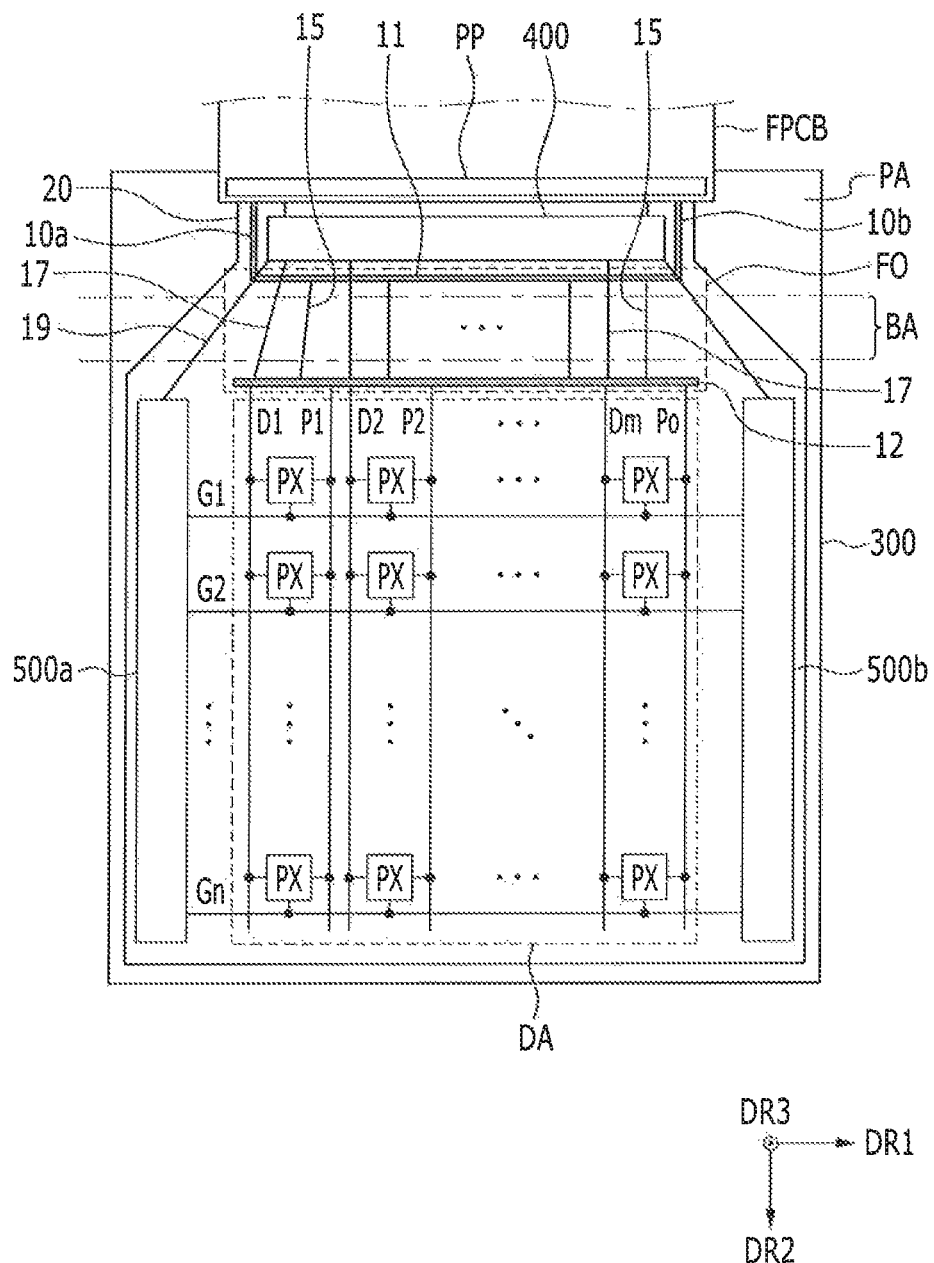
FIG. 1 is a schematic top plan view of a display device according to an exemplary embodiment of the inventive concept.

Exemplary embodiments of the inventive concept will be described more fully hereinafter with reference to the accompanying drawings. Like reference numerals may refer to like elements throughout the accompanying drawings.

In the drawings, thicknesses and sizes of multiple layers and areas may be enlarged or reduced in order to clearly express layouts and relative positions thereof. However, the inventive concept is not limited thereto.

In the specification, it will be understood that when an element, such as a layer, film, region, or substrate, is referred to as being "on" another element, it can be directly on the other element or intervening elements may also be present. If not particularly defined in the specification, "overlapping" means that at least some parts of a layer, a film, an area, a plate, or the like overlap with each other in a plan view.

Although an organic light emitting diode display will be described below as an example of as a display device according to an exemplary embodiment of the inventive concept, the inventive concept is not limited to the organic light emitting diode display. Any display device to which a driving voltage is supplied is applicable.

Exemplary embodiments of the inventive concept provide display devices that can reduce the resistance of a driving voltage supply wire.

FIG. 1 is a schematic top plan view of a display device according to an exemplary embodiment of the inventive concept.

Referring to FIG. 1, a display device according to an exemplary embodiment of the inventive concept includes a display panel 300. The display panel 300 includes a display area DA where an image may be displayed, and a peripheral area PA where elements and/or wires for generation and/or transmission of various signals applied to the display area DA are arranged.

A plurality of pixels PX is, for example, arranged in a matrix format in the display area DA of the display panel 300. In the display area DA, signal lines such as a plurality of gate lines G1 to Gn, a plurality of data lines D1 to Dm, and a plurality of driving voltage lines P1 to Po are arranged. The plurality of gate lines G1 to Gn may substantially extend in a first direction DR1 (e.g., a row direction), and the plurality of data lines D1 to Dm and the plurality of driving voltage lines P1 to Po may extend in a second direction DR2 (e.g., a column direction) that crosses the first direction DR1. Each pixel PX is connected with a corresponding gate line among the gate lines G1 to Gn, a corresponding data line among the data lines D1 to Dm, and a corresponding driving voltage line among the driving voltage lines P1 to Po to receive a gate signal, a data voltage, and a driving voltage from the signal lines.

A driving device including a driving circuit chip 400 and gate drivers 500a and 500b that generate and/or process signals for driving the peripheral area PA provided in the display panel 300.

The driving circuit chip 400 includes a data driver, and may be mounted as an integrated circuit chip on the display panel 300. The driving circuit chip 400 may be disposed in an upper side or a lower side of the display area DA with respect to the top plan view. According to exemplary embodiments of the inventive concept, the display device may include a plurality of driving circuit chips 400.

The gate drivers 500a and 500b may be integrated with the display panel 300. The gate drivers 500a and 500b may include a first gate driver 500a disposed in the left side in the display area DA and a second gate driver 500b disposed in the right side in the display area DA with respect to the top plan view. According to exemplary embodiments of the inventive concept, the gate driver may be disposed in only one of the left side or the right side, and may be electrically connected to the display panel in the form of a tape carrier package (TCP).

The driving circuit chip 400 includes a signal controller that controls the data driver and the gate drivers 500a and 500b. According to exemplary embodiments of the inventive concept, the signal controller may be provided as a chip that is separate from the data driver, and for example, may be provided as an integrated circuit chip on an external printed circuit board of the display panel 300. Thus, the driving circuit chip 400 mounted on the display panel 300 may include only the data driver with the signal controller provided separately or externally.

A flexible printed circuit board (FPCB) that transmits an external signal to the display panel 300 is attached to the peripheral area PA of the display panel 300. The FPCB may be attached to a pad portion PP that is disposed further from the display area DA than the driving circuit chip 400 in the peripheral area PA. Thus, the pad portion PP may be disposed between an outer edge of the display panel 300 and the driving circuit chip 400. The driving circuit chip 400 may receive an image signal and a control signal of the image signal through the FPCB and the pad portion PP. When the signal controller is provided separately from the driving circuit chip 400, the driving circuit chip 400 may receive image data, a data control signal, and the like, supplied from the signal controller through the FPCB and the pad portion PP.

The gate lines G1 to Gn of the display area DA receive a gate signal that includes a gate on voltage and a gate off voltage through the gate drivers 500a and 500b. The gate drivers 500a and 500b receive a vertical start signal, a clock signal, and a low voltage at a predetermined level from the driving circuit chip 400 through a gate signal line 19 connected to the driving circuit chip 400, so as to generate the gate signal. In FIG. 1, although it is shown as a single line, the gate signal line 19 may include one or more signal lines that correspond to the number of signals applied to the gate drivers 500a and 500b, or the number of signal lines may be smaller or greater than the number of signals. When the signal controller is provided separately from the driving circuit chip 400, at least one of the gate signal lines 19 may be directly connected to the pad portion PP rather than connected to the driving circuit chip 400.

The data lines D1 to Dm receive a data voltage from the data driver. For this, a data connection line 17, connected to the driving circuit chip 400 that includes the data driver and the data lines D1 to Dm, is disposed in the peripheral area PA, e.g., in a fanout area FO.

The driving voltage lines P1 to Po of the display area DA receive a driving voltage through a driving voltage supply wire disposed in the peripheral area PA. The driving voltage supply wire includes driving voltage supply lines 10a and 10b, a first driving voltage transmission line 11, and a second driving voltage transmission line 12. The driving voltage supply lines 10a and 10b are connected with the pad portion PP, to which the FPCB is attached, and substantially extend in parallel. The first driving voltage transmission line 11 extends substantially in a direction parallel with the first direction DR1 from one end of the driving voltage supply line 10a to one end of the driving voltage supply line 10b. The second driving voltage transmission line 12 is separate from the first driving voltage transmission line 11 and extends substantially in a direction parallel with the first direction DR1 (and thus, parallel with the first driving voltage transmission line 11). The driving voltage supply wire also includes a plurality of driving voltage connection lines 15, each of which has one end connected to the first driving voltage transmission line 11 and the other end connected to the second driving voltage transmission line 12. The driving voltage supply lines 10a and 10b receive a driving voltage through the pad portion PP, and the driving voltage is transmitted to the driving voltage lines P1 to Po through the first driving voltage transmission line 11, the plurality of driving voltage connection lines 15, and the second driving voltage transmission line 12. According to exemplary embodiments of the inventive concept, the driving voltage supply lines 10a and 10b may be connected to the driving circuit chip 400 and thus receive the driving voltage therethrough.

In the top plan view, the driving voltage supply lines 10a and 10b are disposed on the left side and the right side of the driving circuit chip 400, respectively, and the first driving voltage transmission line 11 connects the ends of the driving voltage supply lines 10a and 10b, as described above. Thus, the driving circuit chip 400 may be surrounded by the driving voltage supply lines 10a and 10b, the first driving voltage transmission line 11, and the pad portion PP. According to exemplary embodiments of the inventive concept, the driving voltage supply lines 10a and 10b may be disposed at only one of the left or right sides of the driving circuit chip 400, or may be disposed in plural on the left side and/or the right side of the driving circuit chip 400.

Since the first driving voltage transmission line 11 and the second driving voltage transmission line 12 are disposed between the driving circuit chip 400 and the display area DA, they overlap with the data connection line 17 in a third direction DR3 (e.g., when viewed in a plan view), which is perpendicular to the plane formed by the first direction DR1 and the second direction DR2, in an insulated manner.

The plurality of driving voltage connection lines 15 connects to the first driving voltage transmission line 11 and the second driving voltage transmission line 12 at many points. In wire design, there is a limit to how much a line width of the driving voltage supply lines 10a and 10b may be increased. Therefore, according to the present exemplary embodiment, the first driving voltage transmission line 11 is formed and then the first driving voltage transmission line 11 is connected to the second driving voltage transmission line 12 through the plurality of driving voltage connection lines 15. As such, resistance in the driving voltage supply wires can be lower compared to the resistance when the driving voltage supply lines 10a and 10b are directly connected to the second driving voltage transmission line 12. Since the resistance of the driving voltage supply wires is reduced, a load effect can be reduced, and accordingly, occurrence of a luminance difference in a light emission area of the display panel 300 can be prevented or reduced.

A common voltage supply line 20 is provided in the peripheral area PA of the display panel 300 to supply a common voltage to the pixels PX. The common voltage supply line 20 receives a common voltage at a predetermined level through the pad portion PP and applies the common voltage to a common electrode of each of the pixels PX. The common voltage supply line 20 may be disposed further from the driving circuit chip 400 than the driving voltage supply lines 10a and 10b. The common voltage supply line 20 may surround the display area DA, or may be disposed in a part of the display area DA. For example, in the top plan view, the common voltage supply line 20 may be disposed only on the left side and/or the right side of the display area DA.

Figure 2:
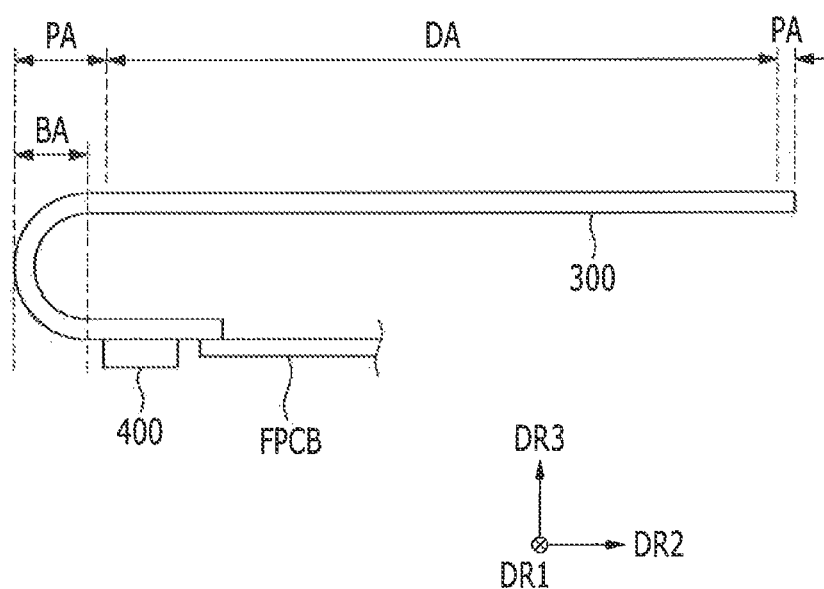
FIG. 2 is a side view illustrating a display device of FIG. 1 in a bent state according to an exemplary embodiment of the inventive concept.

FIG. 2 is a schematic side view illustrating the display device of FIG. 1 in a bent state according to an exemplary embodiment of the inventive concept.

Referring to FIG. 1 and FIG. 2, the peripheral area PA of the display panel 300 may include a bending area BA, and the display panel 300 may be bent with a predetermined curvature in the bending area BA. For bending, the display panel 300 may be entirely made of a flexible material or at least the bending area BA may be made of a flexible material.

As described, when the display panel 300 is bent, the width of the peripheral area PA when being viewed from the front (e.g., the top plan view) can be reduced so that the width of a bezel that covers the peripheral area PA in the display device, such as a smart phone, can be reduced. However, to bend the display panel 300, the width of the peripheral area PA, where the bending area BA is located, is increased and accordingly, a distance between the pad portion PP and the display area DA is increased. Since the distance between the pad portion PP and the display area DA is increased, the length of the driving voltage supply wire (e.g., the driving voltage supply lines 10a and 10b) is increased to transmit the driving voltage to the display area PA from the pad portion PP. As such, the length increase of the driving voltage supply wire causes an increase in wire resistance. According to exemplary embodiments of the inventive concept, resistance of the driving voltage supply wire can be reduced through the first driving voltage transmission line 11 and the plurality of driving voltage connection lines 15, as described above. Accordingly, the load effect that may increase due to the bending area BA can be reduced.

Hereinabove, the display device according to an exemplary embodiment of the inventive concept has been described. A driving voltage supply wire according to exemplary embodiments of the inventive concept will be described below in relation to a data connection line.

Figure 3:
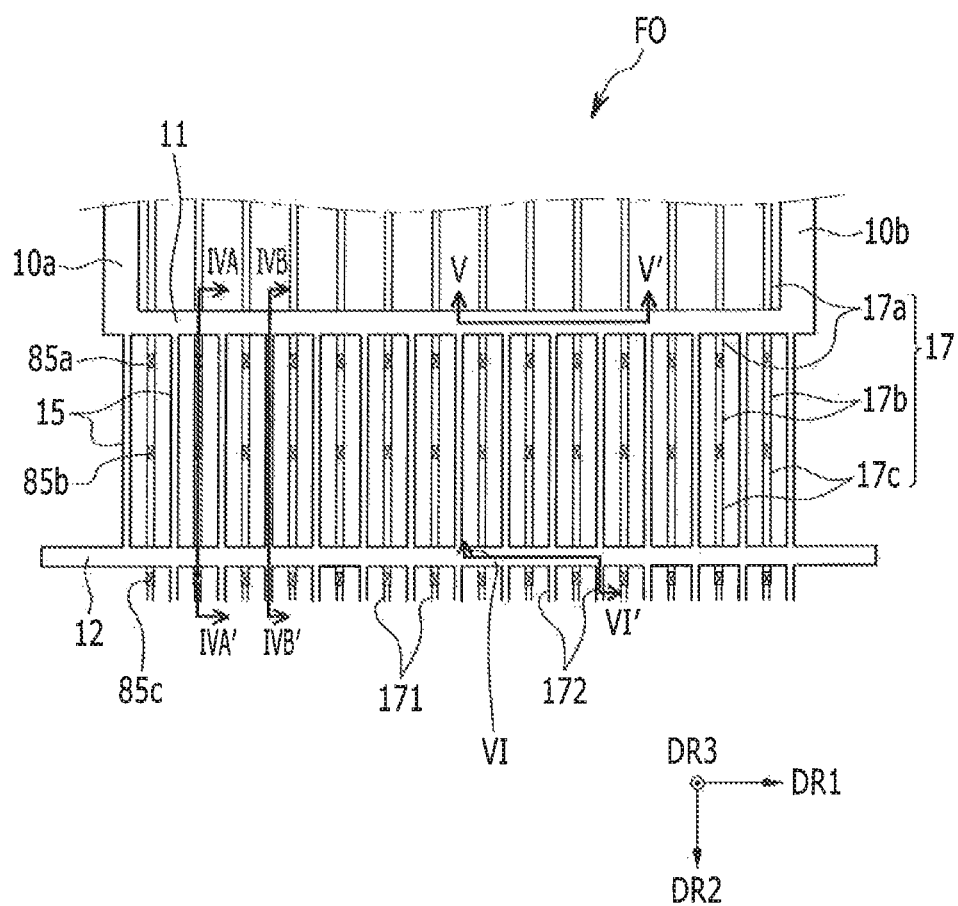
FIG. 3 is a top plan view illustrating a fanout area in FIG. 1 according to an exemplary embodiment of the inventive concept.
Figure 4A:
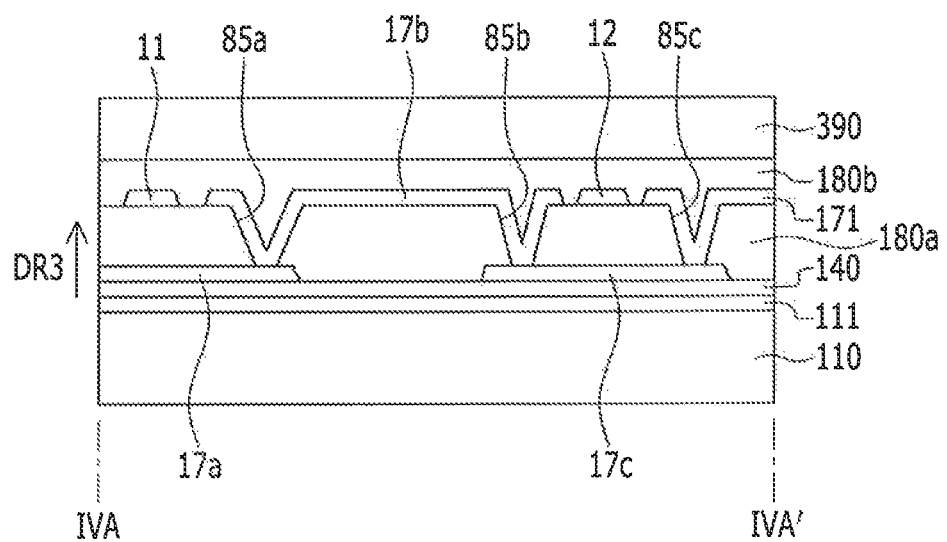
FIGS. 4A and 4B are cross-sectional views of FIG. 3, taken along the lines IVA-IVA' and IVB-IVB', respectively, according to an exemplary embodiment of the inventive concept.
Figure 4B:
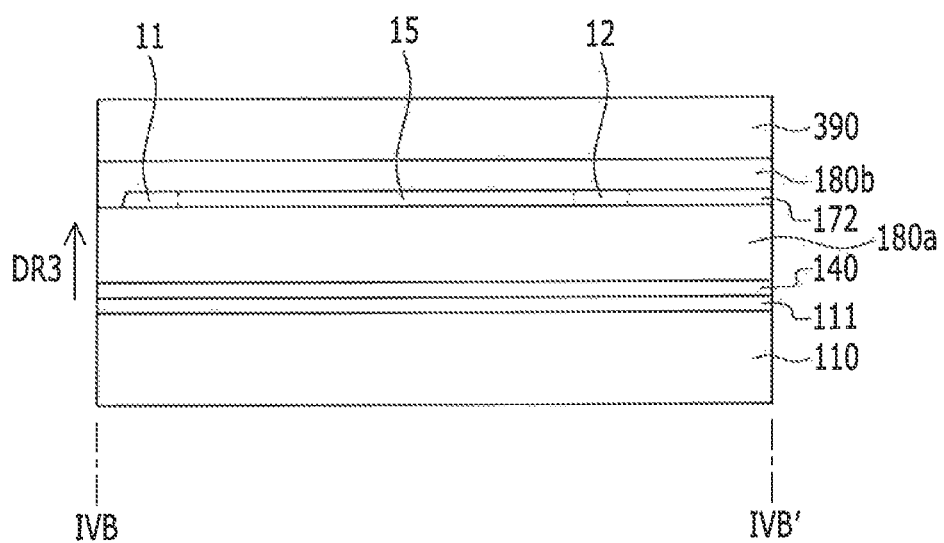
Figure 5:
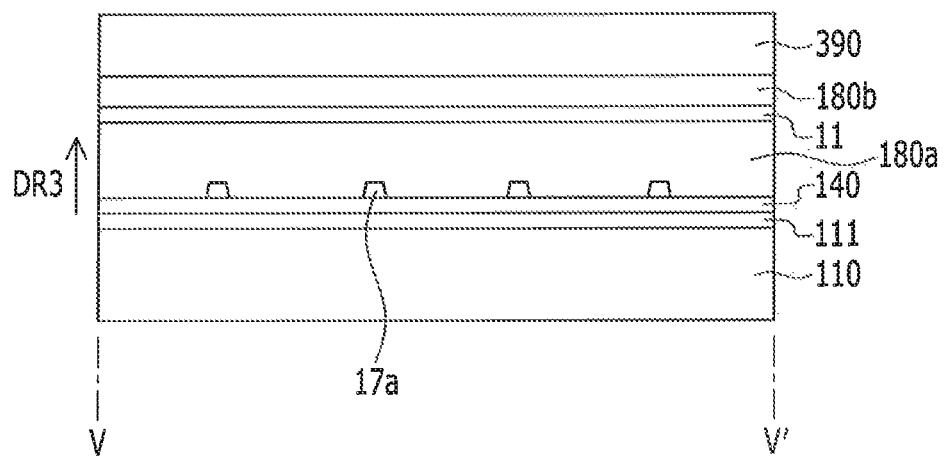
FIG. 5 is a cross-sectional view of FIG. 3, taken along the line V-V' according to an exemplary embodiment of the inventive concept.
Figure 6:
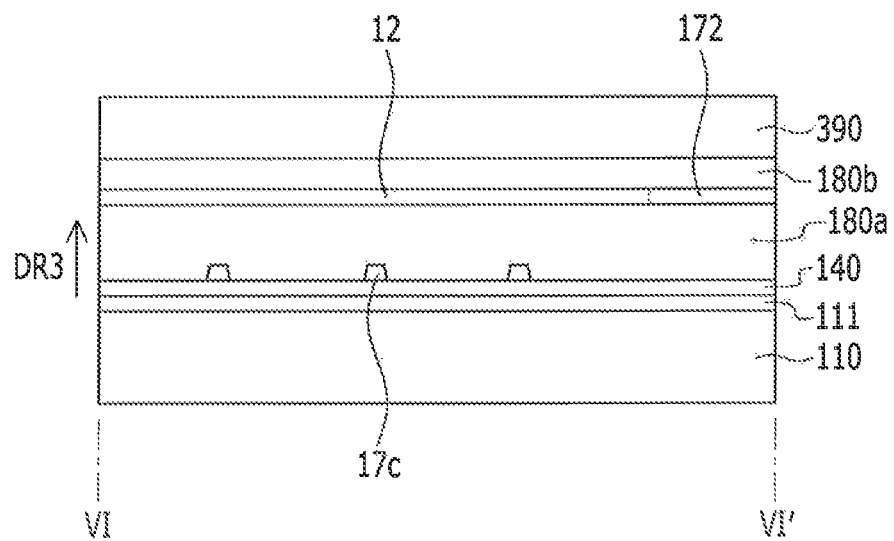
FIG. 6 is a cross-sectional view of FIG. 3, taken along the line VI-VI' according to an exemplary embodiment of the inventive concept.

FIG. 3 is a top plan view illustrating the fanout area FO of FIG. 1, FIGS. 4A and 4B are cross-sectional views of FIG. 3, taken along the lines IVA-IVA' and IVB-IVB', respectively, FIG. 5 is a cross-sectional view of FIG. 3, taken along the line V-V', and FIG. 6 is a cross-sectional view of FIG. 3, taken along the line VI-VI', according to exemplary embodiments of the inventive concept.

Referring to FIG. 3 together with FIG. 1, the driving voltage supply lines 10a and 10b are formed in parallel with each other substantially along the second direction DR2, and the first driving voltage transmission line 11 that connects the ends of the driving voltage supply lines 10a and 10b is formed substantially in parallel with the first direction DR1. It is illustrated in FIG. 3 that lateral ends of the first driving voltage transmission line 11 contact the ends of the driving voltage supply lines 10a and 10b. However, the lateral ends of the first driving voltage transmission line 11 may extend further than (e.g., past) the ends of the driving voltage supply lines 10a and 10b.

The second driving voltage transmission line 12 is distanced from the first driving voltage transmission line 11 in the second direction DR2, and is formed in parallel with the first driving voltage transmission line 11 along the first direction DR1. The second driving voltage transmission line 12 may be adjacent to the display area DA, and may have a length that is substantially the same as the width of the display area DA.

The plurality of driving voltage connection lines 15 connecting the first driving voltage transmission line 11 and the second driving voltage transmission line 12 may be substantially in parallel with the plurality of data connection lines 17 that connects the driving circuit chip 400 and the plurality of data lines D1 to Dm. As an example, the driving voltage supply lines 10a and 10b may each have approximately a micrometer-sized width, the first driving voltage transmission line 11 and the second driving voltage transmission line 12 may each have a width of about 50 to about 200 micrometers, and the driving voltage connection line 17 may have a width of about 3 micrometers. However, the inventive concept is not limited thereto.

In the illustrated exemplary embodiments, the driving voltage connection lines 15 and the data connection lines 17 are alternately disposed one by one. As described, when the plurality of driving voltage connection lines 15 are formed, the entire width of the driving voltage connection lines 15 can be increased even though each of the driving voltage connection lines 15 has a narrow width. The driving voltage supply lines 10a and 10b may be directly connected to the second driving voltage transmission line 12 and the width of the driving voltage supply lines 10a and 10b may be increased to reduce the resistance of the driving voltage wire. However, because of other wires, there is a limit to how much the width of the driving voltage supply lines 10a and 10b may be increased. According to the exemplary embodiments of the inventive concept, the resistance of the driving voltage wire can be reduced without substantially affecting the alignment or arrangement of other wires. Although the driving voltage connection lines 15 are disposed at the outermost edge on the left and right sides in FIG. 3, the data connection lines 17 may instead be disposed at the outermost edge on at least one of the left side or the right side.

Referring to FIG. 4A, FIG. 4B, FIG. 5, and FIG. 6, several cross-sections of FIG. 3 are illustrated. A buffer layer 111 and a gate insulation layer 140 are disposed on a substrate 110, and a first portion 17a and a third portion 17c of the data connection line 17 are disposed on the gate insulation layer 140. A first passivation layer 180a, which is an insulating layer, is disposed on the first and third portions 17a and 17c, and the first driving voltage transmission line 11, the second driving voltage transmission line 12, and the driving voltage connection line 15 are disposed on the first passivation layer 180a. A second portion 17b of the data connection line 17 is disposed on the first passivation layer 180a, and the second portion 17b is connected with the first portion 17a and the third portion 17c of the data connection line 17 through contact holes 85a and 85b formed in the first passivation layer 180a. The second portion 17b may be disposed in the bending area BA in the peripheral area PA. A second passivation layer 180b is disposed on the first driving voltage transmission line 11, the second driving voltage transmission line 12, the driving voltage connection line 15, and the second portion 17b of the data connection line 17, and an encapsulation layer 390 may be disposed thereover. According to exemplary embodiments of the inventive concept, at least one of the buffer layer 111, the gate insulation layer 140, the second passivation layer 180b, or the encapsulation layer 400 may be omitted. The buffer layer 111 and the gate insulation layer 140 may be eliminated from the bending area BA, and for example, at least a portion that overlaps with the first portion 17a of the data connection line 17 in FIG. 4A may not be included.

In the illustrated exemplary embodiment, the data connection lines 17 include the first portion 17a, the second portion 17b, and the third portion 17c, and the second portion 17b is formed in a layer that is different from a layer where the first portion 17a and the third portion 17c are formed. In FIG. 4A, the first portion 17a and the third portion 17c are disposed below the first driving voltage transmission line 11 and the second driving voltage transmission line 12 with the first passivation layer 180a interposed therebetween, and the second portion 17b is disposed in the same layer as that of the first and second driving voltage transmission lines 11 and 12. Accordingly, when the second portion 17b is formed in a different layer from that of the first portion 17a and the third portion 17c, the second portion 17b disposed in the bending area BA can be made of a material that can be easily bent.

The first portion 17a and the third portion 17c of the data connection lines 17 may be made of substantially the same material and in the same layer as that of, for example, the gate lines G1 to Gn. The second portion 17b of the data connection lines 17, the first driving voltage transmission line 11, the second driving voltage transmission line 12, and the driving voltage connection line 15 may be, for example, made of substantially the same material and in the same layer as that of the data lines D1 to Dm. Here, a wire made of substantially the same material and in the same layer as that of the gate line is referred to as a gate conductor, and a wire made of substantially the same material and in the same layer as that of the data line is referred to as a data conductor. The gate conductor may include a metal such as molybdenum (Mo), copper (Cu), aluminum (Al), silver (Ag), chromium (Cr), tantalum (Ta), titanium (Ti), or a metal alloy thereof. The data conductor may include a metal such as copper (Cu), aluminum (Al), silver (Ag), molybdenum (Mo), chromium (Cr), gold (Au), titanium (Pt), palladium (Pd), tantalum (Ta), tungsten (W), titanium (Ti), nickel (Ni), or a metal alloy thereof. The gate conductor and/or the data conductor may be formed as a single layer or a multilayer.

In the exemplary embodiment of the inventive concept, the gate conductor may be made of a molybdenum-based metal such as molybdenum or a molybdenum alloy, and the data conductor may be made of an aluminum-based metal having a small-sized modulus, such as aluminum or an aluminum alloy. Because of their material, the second portion 17b of the data connection lines 17 in the bending area BA and the driving voltage connection line 15 have low stress caused by strain such that the risk of a short-circuit or degradation due to bending can be reduced. In this case, since a molybdenum-based metal has higher resistivity than an aluminum-based metal, the width of the first and third portions 17a and 17c is formed to be wider than the width of the second portion 17b or the thickness of the first and third portions 17a and 17c is formed to be thicker than the thickness of the second portion 17b so that resistance throughout the data connection lines 17 can be more uniform. The data conductor may have a triple-layered structure of, for example, titanium/aluminum/titanium.

A data line 171 of the display area DA is connected to the third portion 17c of the data connection lines 17 through a contact hole 85c formed in the first passivation layer 180a and thus receives a data voltage therefrom. A driving voltage line 172 of the display area DA may extend from the second driving voltage transmission line 12, and thus may be made of substantially the same material and in the same layer as that of the data connection line 17.

Figure 7:
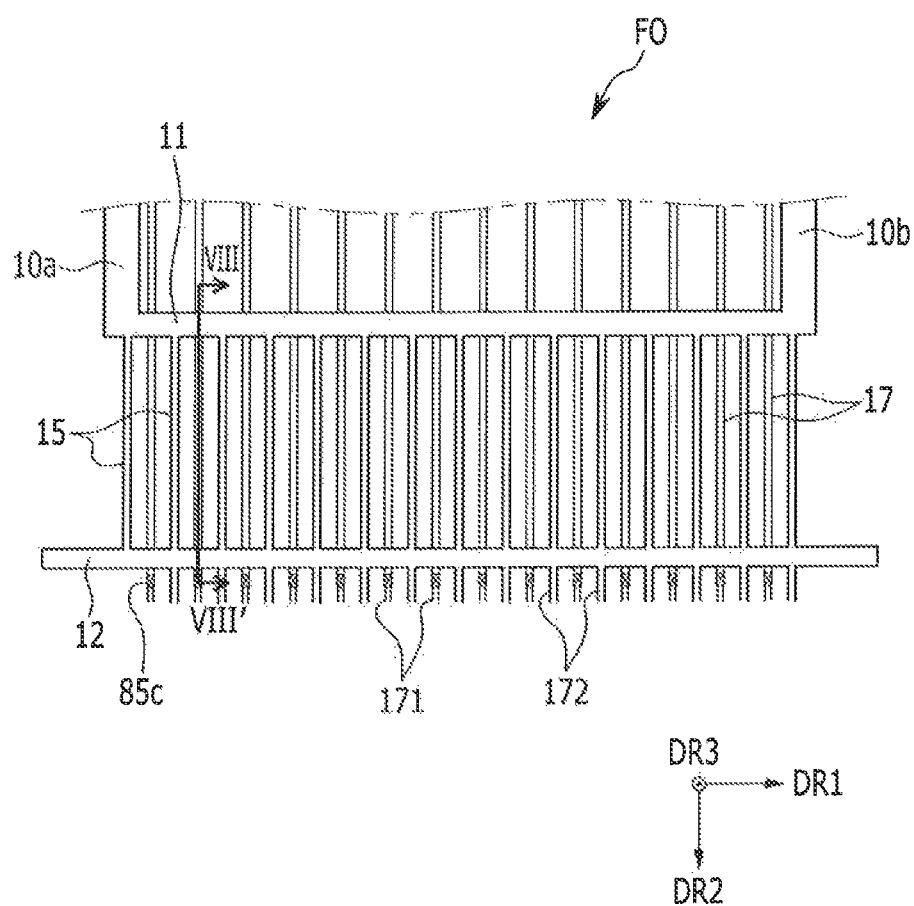
FIG. 7 is a top plan view illustrating a fanout area in FIG. 1 according to an exemplary embodiment of the inventive concept.
Figure 8:
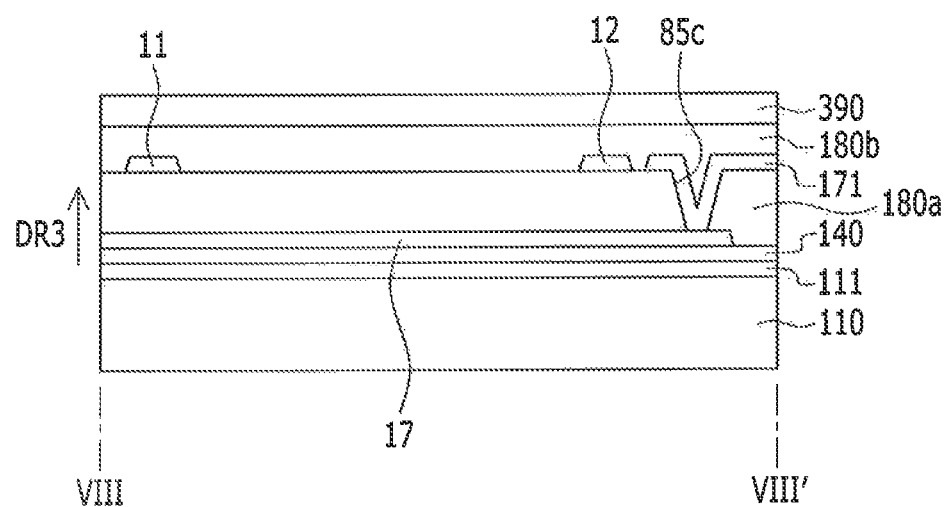
FIG. 8 is a cross-sectional view of FIG. 7, taken along the line VIII-VIII' according to an exemplary embodiment of the inventive concept.

FIG. 7 is a top plan view illustrating the fanout area of FIG. 1, and FIG. 8 is a cross-sectional view of FIG. 7, taken along the line VIII-VIII', according to exemplary embodiments of the inventive concept.

Referring to FIG. 7 and FIG. 8, unlike the exemplary embodiment shown in FIG. 4A, the data connection lines 17 are formed as a single layer rather than two separate layers. Other wires 11, 12, 15, 171, and 172 may be substantially the same as those in the exemplary embodiment of FIG. 4A. When both the gate conductor and the data conductor are made of a material having a low modulus, risks of short-circuits and degradation of the data connection lines 17 and the driving voltage connection line 15 provided in the bending area BA can be reduced.

Figure 9:
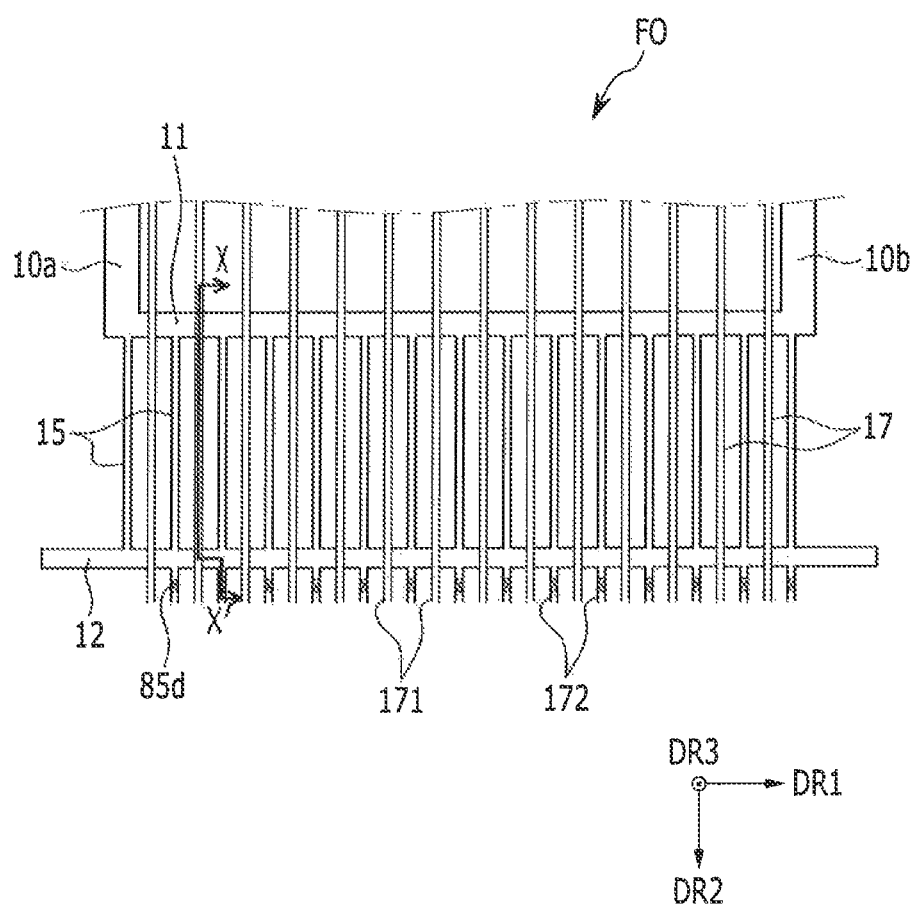
FIG. 9 is a top plan view illustrating a fanout area of FIG. 1 according to an exemplary embodiment of the inventive concept.
Figure 10:
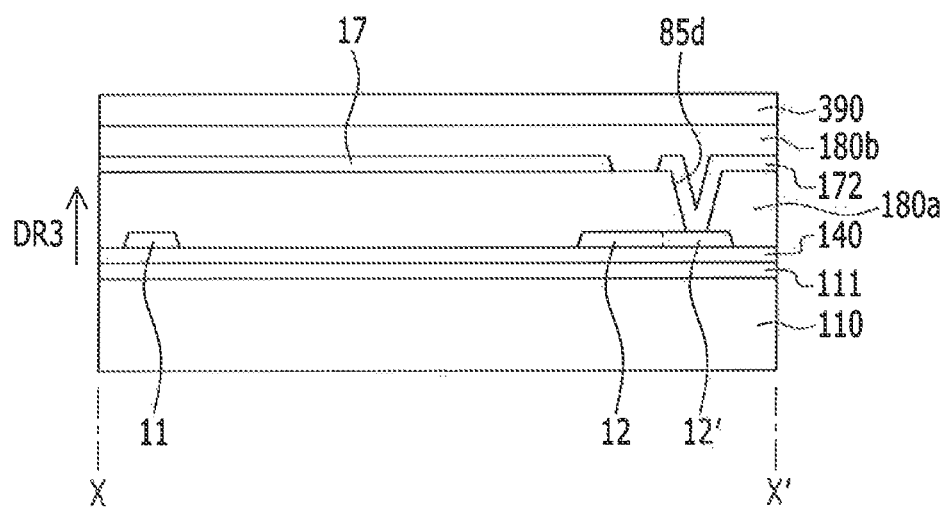
FIG. 10 is a cross-sectional view of FIG. 9, taken along the line X-X' according to an exemplary embodiment of the inventive concept.

FIG. 9 is a top plan view illustrating the fanout area of FIG. 1, and FIG. 10 is a cross-sectional view of FIG. 9, taken along the line X-X', according to exemplary embodiments of the inventive concept.

Referring to FIG. 9 and FIG. 10, an example in which the data connection lines 17 are disposed on the driving voltage supply wire is illustrated. The buffer layer 111 and the gate insulation layer 140 are disposed on the substrate 110. The driving voltage supply wires, such as the driving voltage supply lines 10a and 10b, the first and second driving voltage transmission lines 11 and 12, and the driving voltage connection lines 15, are disposed above the buffer layer 111 and the gate insulation layer 140. The first passivation layer 180a is disposed above the driving voltage supply wires 10a, 10b, 11, 12, and 15, and the data connection lines 17 are disposed above the first passivation layer 180a. The data connection lines 17 are formed as a single layer rather than two separate layers. The data lines 171 and the driving voltage lines 172 are also disposed above the first passivation layer 180a, and the driving voltage lines 172 are connected to a protrusion 12' of the second driving voltage transmission line 12 through contact holes 85d formed in the first passivation layer 180a. According to the present exemplary embodiment, the driving voltage supply wires 10a, 10b, 11, 12, and 15 may be formed as a gate conductor, and the data connection lines 17, the data lines 171, and the driving voltage lines 172 may be formed as a data conductor. When both the gate conductor and the data conductor are made of a material having a low modulus, risks of short-circuits and degradation of the data connection lines 17 and the driving voltage connection lines 15 provided in the bending area BA can be reduced.

FIG. 9 and FIG. 10 illustrate an example where the driving voltage connection line 15 is formed as a single layer, but the driving voltage connection line 15 may be formed as a plurality of layers. For example, similar to the data connection line 17 in the exemplary embodiments of FIG. 3 to FIG. 6, the driving voltage connection line 15 may include a portion disposed above the first passivation layer 180a only in the bending area BA and formed as a data conductor. The portion of the driving voltage connection line 15 above the first passivation layer 180a may be connected to a portion of the driving voltage connection line 15, disposed below the first passivation layer 180a, through contact holes formed in the first passivation layer 180a. In this case, although only the data conductor is made of a material having a smaller modulus, risks of short-circuits and degradation of the driving voltage connection line 15 and the data connection line 17 in the bending area BA can be reduced.

Figure 11:
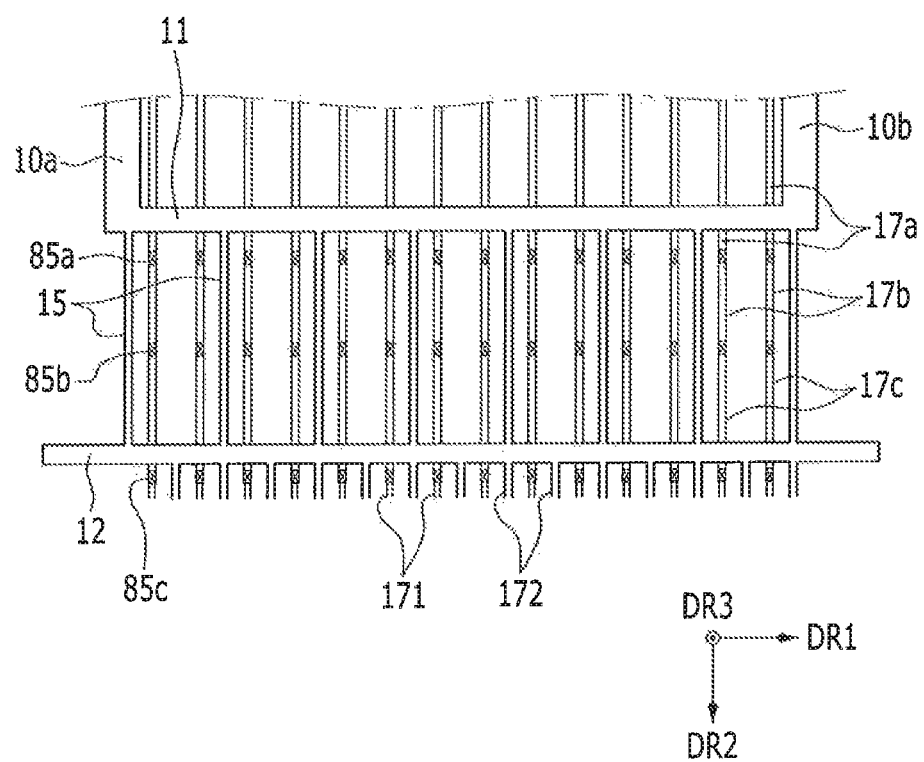
FIG. 11 is a top plan view illustrating a fanout area of FIG. 1 according to an exemplary embodiment of the inventive concept.
Figure 12:
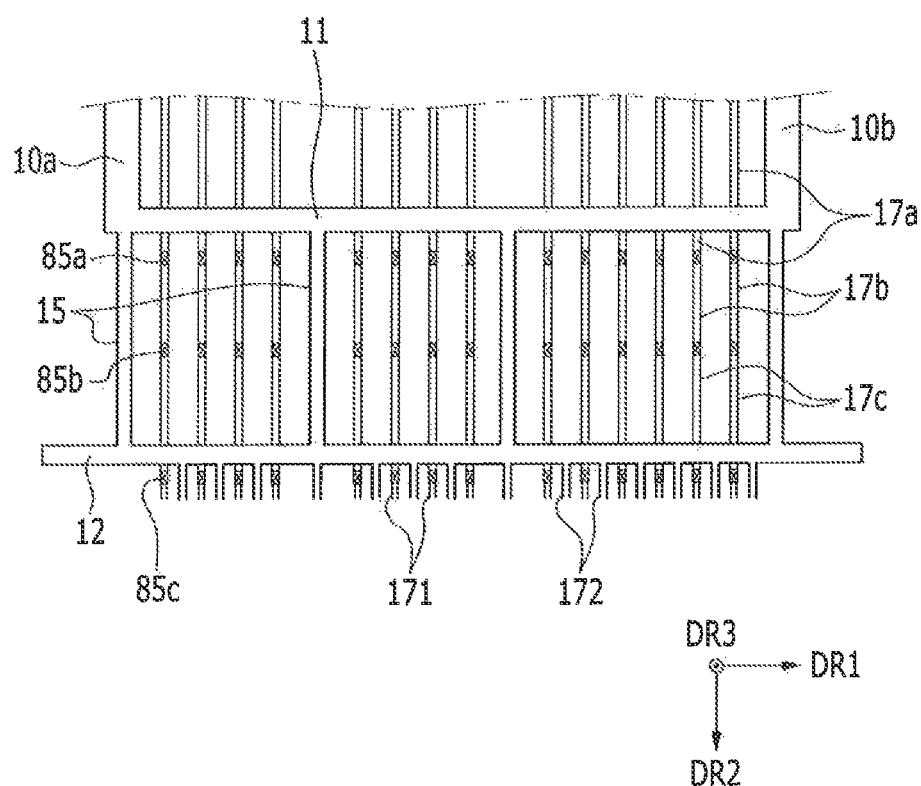
FIG. 12 is a top plan view illustrating a fanout area of FIG. 1 according to an exemplary embodiment of the inventive concept.

FIG. 11 and FIG. 12 are top plan views illustrating the fanout area FA of FIG. 1, according to exemplary embodiments of the inventive concept.

Unlike the exemplary embodiment of FIG. 3 to FIG. 6 where the driving voltage connection lines 15 and data connection lines 17 are alternately arranged one by one, a plurality of data connection lines 17 are disposed between adjacent driving voltage connection lines 15 in the exemplary embodiments of FIG. 11 and FIG. 12. FIG. 11 illustrates two data connection lines 17 disposed between adjacent driving voltage connection lines 15, and FIG. 12 illustrates four or more data connection lines 17 disposed between adjacent driving voltage connection lines 15. When the driving voltage connection lines 15 are so disposed, the number of driving voltage connection lines 15 may be reduced compared to the exemplary embodiment of FIG. 3 to FIG. 6, and accordingly, the entire resistance of the driving voltage connection lines 15 may be increased. To prevent the resistance increase, the driving voltage connection line 15 may have, for example, a width that is wider than the width of the data connection line 17, as shown in FIG. 12. When sufficient space cannot be assured between the data connection lines 17, only the driving voltage connection lines 15 disposed on the outermost left side and the outermost right side may have a relatively wider width. The alignment and relative width of the driving voltage connection lines 15 and the data connection lines 17 of the present exemplary embodiment may be applied to the exemplary embodiment of FIG. 7 and FIG. 8 and the exemplary embodiment of FIG. 9 and FIG. 10, where the data connection line 17 is formed as a single layer.

The exemplary embodiments of FIG. 3 to FIG. 6, FIG. 11, and FIG. 12 may be implemented in a variety of combinations. For example, a portion where data connection lines 17 and driving voltage connection lines 15 are alternately arranged one by one and a portion where a plurality of data connection lines 17 are arranged between adjacent driving voltage connection lines 15 may be formed in the fanout area FO. As another example, when the driving voltage connection lines 15 and the data connection lines 17 are alternately arranged one by one, the driving voltage connection lines 15 disposed on the outermost left side and the outermost right side may have a wide width. The above-stated various combinations and modifications may also be applied to the exemplary embodiment of FIG. 7 and FIG. 8 and the exemplary embodiment of FIG. 9 and FIG. 10.

Hereinabove, several methods for reducing wire resistance in driving voltage supply wires have been described. A structure and alignment applied to the driving voltage supply wire may also be applied to the common voltage supply line or wire. Referring to FIG. 1, the common voltage supply line 20 is formed to surround the display area DA through the bending area BA from the pad portion PP. However, a portion of the common voltage supply line 20, extending substantially in parallel with the second direction DR2 from the pad portion PP, is connected to a first common voltage transmission line substantially extended in parallel with the first direction DR1. The first common voltage transmission line may be connected to a second common voltage transmission line, which substantially extends in parallel with the first direction DR1 between the bending area BA and the display area DA, through a plurality of common voltage connection lines that may be alternatively disposed substantially alongside the data connection lines 17. In this case, portions of the common voltage supply line 20, disposed on the left side and the right side of the display area DA, may be connected to lateral ends of the second common voltage transmission line. When the common voltage supply wires are formed as described above, resistance of the common voltage supply wires can be reduced to then reduce a load effect.

The driving voltage supply wire may be typically formed (e.g., the driving voltage supply lines 10a and 10b are directly connected to the second driving voltage transmission line 12) and only the common voltage supply line 20 may be provided as described above to reduce wire resistance, or the driving voltage supply wire and the common voltage supply line 20 may both be provided as described above to reduce wire resistance. In the latter case, the first common voltage transmission line and the second common voltage transmission line may be disposed between the first driving voltage transmission line 11 and the bending area BA and between the bending area BA and the second driving voltage transmission line 12, respectively, or the driving voltage connection line 15, the common voltage connection line, and the data connection line 17 may be substantially alternately disposed.

Figure 13:
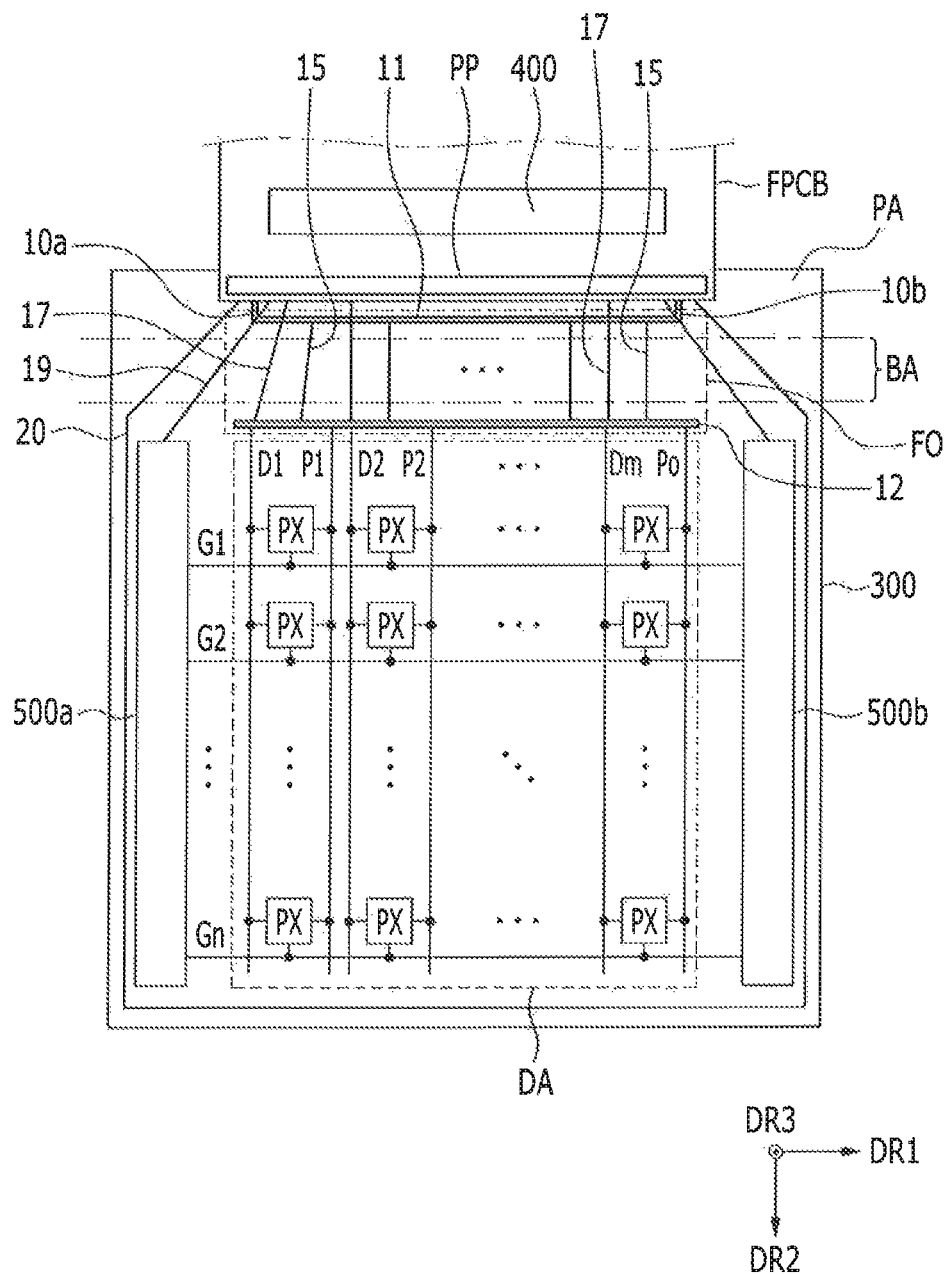
FIG. 13 is a schematic top plan view of a display device according to an exemplary embodiment of the inventive concept.

FIG. 13 is a schematic top plan view of a display device according to an exemplary embodiment of the inventive concept.

Referring to FIG. 13, compared to the display device according to the exemplary embodiment of FIG. 1, a mounting location of the driving circuit chip 400 is different in the present exemplary embodiment. The driving circuit chip 400 is mounted on the FPCB rather than on the display panel 300. In this case, the plurality of data connection lines 17 may be directly connected to the pad portion PP on the display panel 300, to which the FPCB is attached.

Alignment and arrangement of other constituent elements of the display device may be substantially equivalent to the exemplary embodiment of FIG. 1. For example, the driving voltage supply lines 10a and 10b are provided on the left side and the right side of the plurality of the data connection lines 17, respectively, and are formed substantially in parallel with the second direction DR2, extending from the pad portion PP. The first driving transmission line 11 formed at the ends of the driving voltage supply lines 10a and 10b is formed substantially in parallel with the first direction DR1, and accordingly, crosses the plurality of data connection lines 17 in an overlapping manner. The second driving voltage transmission line 12 is distanced from the first driving voltage transmission line 11, and extends substantially in parallel with the first direction DR1 at the periphery of the display area DA. The plurality of driving voltage connection lines 15 connects the first driving voltage transmission line 11 and the second driving voltage transmission line 12. Since the driving circuit chip 400 is disposed further from the display area DA than the pad portion PP, unlike the exemplary embodiment of FIG. 1, the driving circuit chip 400 is not surrounded by the driving voltage supply lines 10a and 10b, the first driving voltage transmission line 11, and the pad portion PP. However, the relationship between the driving voltage wire and the data connection lines, as described with reference to FIG. 3 to FIG. 12, may be applied to the present exemplary embodiment.

Hereinabove, various signal lines, particularly, the driving voltage wires, have been described with reference to the peripheral area PA of the display device. With respect to FIG. 14, FIG. 15, and FIG. 16, the display device will be described below, focusing on the pixels disposed in the display area DA of the display device, according to exemplary embodiments of the inventive concept.

Figure 14:
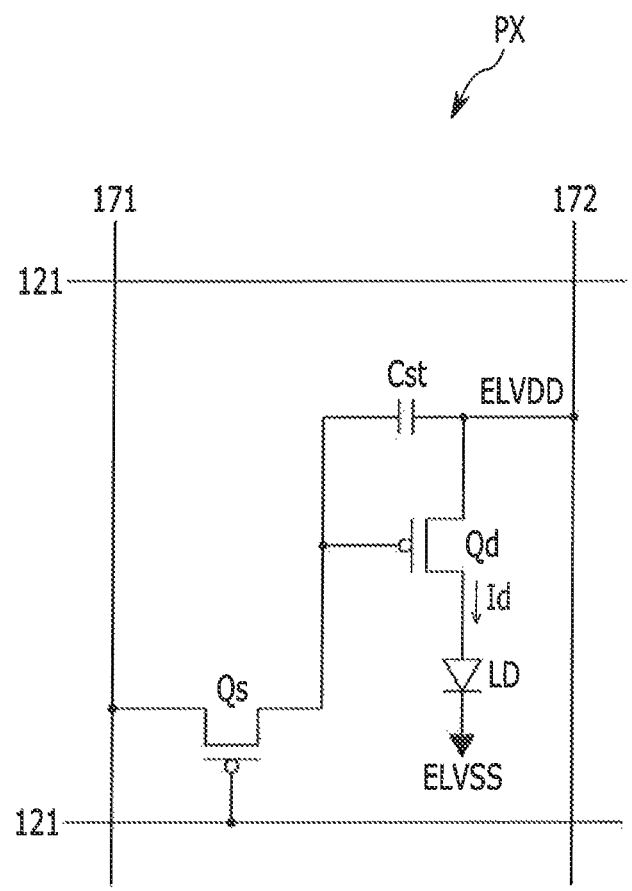
FIG. 14 is an equivalent circuit diagram of one pixel in a display device according to an exemplary embodiment of the inventive concept.
Figure 15:
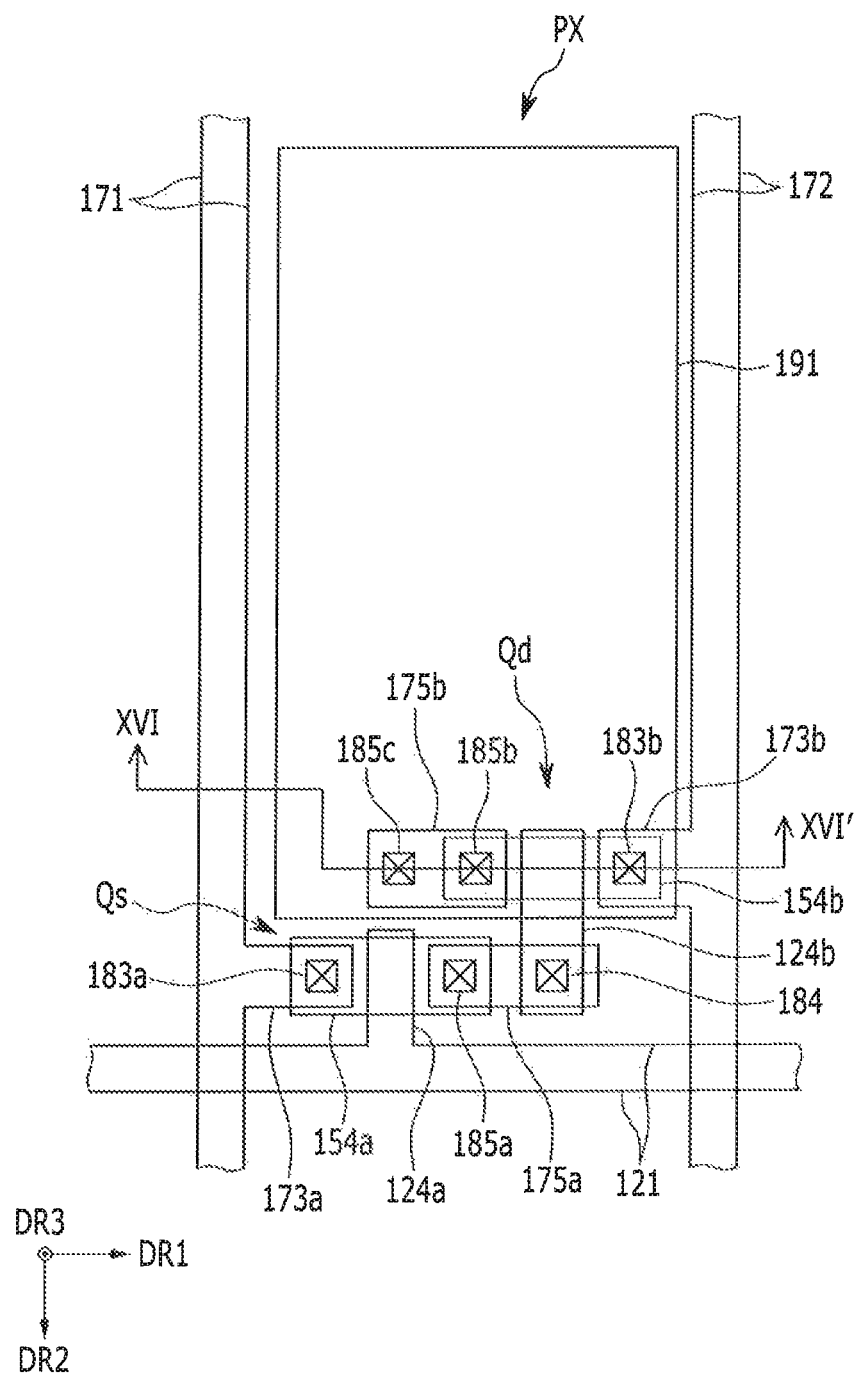
FIG. 15 is a layout view of a pixel area of a display device according to an exemplary embodiment of the inventive concept.
Figure 16:
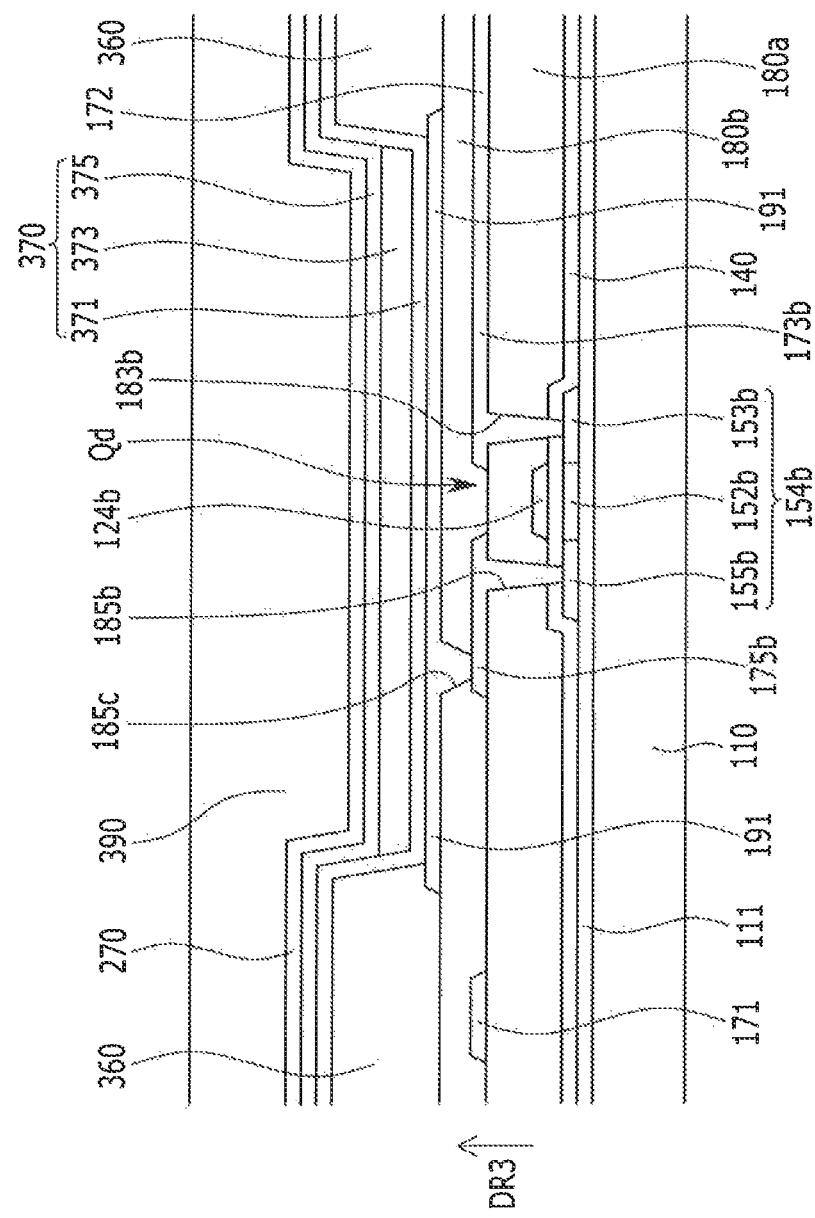
FIG. 16 is a cross-sectional view of FIG. 15, taken along the line XVI-XVI' according to an exemplary embodiment of the inventive concept.

FIG. 14 is an equivalent circuit diagram of one pixel in the display device according to an exemplary embodiment of the inventive concept, FIG. 15 is a layout view of a pixel area of the display device according to an exemplary embodiment of the inventive concept, and FIG. 16 is a cross-sectional view of FIG. 15, taken along the line XVI-XVI'.

Referring to FIG. 14, the display device includes a plurality of signal lines and the plurality of pixels PX connected thereto.

The plurality of signal lines includes a plurality of gate lines 121 transmitting a gate signal, the plurality of data lines 171 transmitting a data voltage, and the plurality of driving voltage lines 172 transmitting a driving voltage ELVDD. Referring to FIG. 1 and FIG. 13, the gate line 121 receives the gate signal from the gate drivers 500a and 500b that may be disposed in the peripheral area PA of the display panel 300. The data line 171 receives the data voltage through the data connection lines 17 connected to the driving circuit chip 400 or the pad portion PP. The driving voltage line 172 receives the driving voltage ELVDD through the driving voltage supply lines 10a and 10b, the first driving voltage transmission line 11, the driving voltage connection lines 15, and the second driving voltage transmission line 12.

Each pixel PX includes a switching transistor Qs, a driving transistor Qd, a storage capacitor Cst, and a light emitting element LD.

In the switching transistor Qs, a control terminal is connected to the gate line 121, an input terminal is connected to the data line 171, and an output terminal is connected to the driving transistor Qd. The switching transistor Qs transmits the data voltage applied to the data line 171 to the driving transistor Qd in response to the gate signal applied to the gate line 121.

In the driving transistor Qd, a control terminal is connected to the switching transistor Qs, an input terminal is connected to the driving voltage line 172, and an output terminal is connected to the light emitting element LD. An output current Id flows through the driving transistor Qd. The intensity of the output current Id varies according to a voltage between the control terminal and the output terminal of the driving transistor Qd.

The storage capacitor Cst is connected between the control terminal and the input terminal of the driving transistor Qd. The storage capacitor Cst charges the data voltage applied to the control terminal of the driving transistor Qd and maintains it even after the switching transistor Qs is turned off.

The light emitting element LD, which may be an organic light emitting diode OLED, includes an anode connected to the output terminal of the driving transistor Qd and a cathode connected to a common voltage ELVSS. The light emitting element LD enables an image to be displayed by emitting light with different intensities according to the output current Id from the driving transistor Qd.

The switching transistor Qs and the driving transistor Qd may each be an n-channel field effect transistor (FET) or a p-channel field effect transistor. The connection relationship between the switching transistor Qs, the driving transistor Qd, the storage capacitor Cst, and the light emitting element LD may be changed.

Referring to FIG. 15 and FIG. 16, the display device includes the substrate 110 and the plurality of layers formed thereover. The substrate 110 may be a transparent insulation substrate, e.g., a flexible substrate formed of a transparent polymer film. For example, the substrate 110 may be made of a plastic such as polyethylene terephthalate (PET), polyethylene naphthalate (PEN), polyethylene ether ketone (PEEK), polycarbonate (PC), polyethylene sulfonate (PES), polyimide (PI), or polyarylate (PAR).

The buffer layer 111 may be formed right above the substrate 110 so as to prevent dispersion of an impurity that may cause deterioration of a semiconductor characteristic and to prevent permeation of moisture. The buffer layer 111 may include an inorganic material such as silicon oxide (SiOx), silicon nitride (SiNx), aluminum oxide ($Al_2O_3$), hafnium oxide ($HfO_3$), yttrium oxide ($Y_2O_3$), or the like. The buffer layer 111 may be formed throughout the substrate 110, but may not be formed in the bending area BA shown in FIG. 1 and FIG. 13. According to exemplary embodiments of the inventive concept, the buffer layer 111 may be disposed in the substrate 110. For example, the substrate 110 may have a structure in which a plastic layer and a buffer layer are alternately layered.

A first semiconductor 154a and a second semiconductor 154b are formed above the buffer layer 111. The first semiconductor 154a may include a channel region, a source region, and a drain region. The source region and the drain region are disposed at lateral sides of the channel region and may be doped. The second semiconductor 154b may include a channel region 152b, a source region 153b, and a drain region 155b. The source region 153b and the drain region 155b are disposed at lateral sides of the channel region 152b and may be doped. The first semiconductor 154a and the second semiconductor 154b may include polysilicon. The first semiconductor 154a and the second semiconductor 154b may include a semiconductor oxide or amorphous silicon.

The gate insulation layer 140, which can be made of silicon oxide, silicon nitride, or the like, is disposed on the first semiconductor 154a and the second semiconductor 154b. The gate insulation layer 140 may not be disposed in the bending area BA shown in FIG. 1 and FIG. 13. The gate insulation layer 140 may be formed as a single layer or multiple layers.

A gate conductor including the gate line 121, a first gate electrode 124a, and a second gate electrode 124b is formed on the gate insulation layer 140. The first gate electrode 124a may overlap the channel region of the first semiconductor 154a, and the second gate electrode 124b may overlap the channel region 152b of the second semiconductor 154b. Referring to FIG. 4A, the first portion 17a and the third portion 17c of the data connection lines 17 may be formed as gate conductors in the peripheral area PA of the display panel 300. Referring to FIG. 7 and FIG. 8, the data connection line 17 may be wholly formed as the gate conductor.

The first passivation layer 180a is disposed on the gate insulation layer 140 and the gate conductor. The first passivation layer 180a and the gate insulation layer 140 include a contact hole 183a overlapping the source region of the first semiconductor 154a, a contact hole 185a overlapping the drain region of the first semiconductor 154a, a contact hole 183b overlapping the source region 153b of the second semiconductor 154b, and a contact hole 185b overlapping the drain region 155b of the second semiconductor 154b. Referring to FIG. 4A, the first passivation layer 180a may further include the contact hole 85a overlapping the first portion 17a of the data connection line 17, the contact hole 85b overlapping one end of the third portion 17c of the data connection line 17, and the contact hole 85c overlapping the other end of the third portion 17c of the data connection line 17. The contact holes 85a, 85b, and 85c of the peripheral area may be formed when the contact holes 183a, 183b, 185a, and 185b of the display area are formed, and therefore no additional process is required. The first passivation layer 180a in the pixel area and the first passivation layer 180a in the bending area BA may be made of different materials. For example, the first passivation layer 180a in the pixel area may include an inorganic material such as silicon oxide, silicon nitride, or the like, and the first passivation layer 180a in the bending area BA may include an organic material. A layer made of an inorganic material is susceptible to cracks when being bent, and wires may be damaged due to the cracks.

A data conductor, including the data line 171, the driving voltage line 172, a first source electrode 173a, a second source electrode 173b, a first drain electrode 175a, and a second drain electrode 175b, is formed above the first passivation layer 180a. Referring to FIG. 4A to FIG. 8, FIG. 11, and FIG. 12, in the peripheral area, the first driving voltage transmission line 11, the second driving voltage transmission line 12, the driving voltage connection line 15, and the second portion 17b of the data connection line 17 may be formed as a data conductor. Referring to FIG. 9 and FIG. 10, the data connection line 17 may be wholly formed as a gate conductor.

Each of the first source electrode 173a and the first drain electrode 175a may be respectively connected with the source region and the drain region of the first semiconductor 154a through the contact holes 183a and 185a. The first drain electrode 175a may be connected with the second gate electrode 124b through a contact hole 184. The second source electrode 173b and the second drain electrode 175b may be respectively connected with the source region 153b and the drain region 155b of the second semiconductor 154b through the contact holes 183b and 185b. Referring to FIG. 4A, in the peripheral area, the second portion 17b of the data connection line 17 may be connected with the first portion 17a and the third portion 17c through the contact holes 85a and 85b, and the data line 171 may be connected to the third portion 17c through the contact hole 85c.

The first gate electrode 124a, the first source electrode 173a, and the first drain electrode 175a form a switching transistor Qs together with the first semiconductor 154a, while the second gate electrode 124b, the second source electrode 173b, and the second drain electrode 175b form a driving transistor Qd together with the second semiconductor 154b. In the transistors Qs and Qd, the gate electrodes 124a and 124b are disposed above the semiconductors 154a and 154b and therefore the transistors may be called top-gate transistors. The structure of the switching transistor Qs and the driving transistor Qd may be variously modified. For example, the gate electrodes of the transistors Qd and Qs may be disposed below the semiconductors 154a and 154b. In this case, the transistors may be called bottom-gate transistors.

The second passivation layer 180b, which may be made of an organic material or an inorganic material such as silicon oxide, silicon nitride, or the like, may be provided on the data conductor. The second passivation layer 180b may have a flat surface in order to increase the light emission efficiency of an organic light emitting element to be formed thereon. A contact hole 185c that overlaps the second drain electrode 175b may be formed in the second passivation layer 180b.

A pixel electrode 191 is provided on the second passivation layer 180b. The pixel electrode 191 of each pixel is connected with the second drain electrode 175b through the contact hole 185c of the second passivation layer 180b. The pixel electrode 191 may be made of a reflective or semi-transmissive conductive material, or a transparent conductive material. The pixel electrode 191 may be formed as a single layer or multiple layers.

A pixel defining layer 360 (also referred to as a barrier rib) having a plurality of openings that overlap with the pixel electrode 191 may be provided on the second passivation layer 180b. The openings of the pixel defining layer 360, exposing the pixel electrode 191, may define each pixel area. According to an exemplary embodiment of the inventive concept, the pixel defining layer 360 may be omitted.

A light emitting member 370 is provided on the pixel defining layer 360 and the pixel electrode 191. The light emitting member 370 may include a first organic common layer 371, a light emission layer 373, and a second organic common layer 375 that are sequentially layered.

The first organic common layer 371 may include at least one of a hole injection layer (HIL) and a hole transport layer (HTL). When the first organic common layer 371 includes both the hole injecting layer (HIL) and the hole transport layer (HTL), the hole injecting layer (HIL) and the hole transport layer (HTL) may be sequentially layered. The first organic common layer 371 may be formed on an entire surface of the display area DA in which pixels are disposed, or may be formed only on the pixel area.

The light emission layer 373 may be provided on the pixel electrode 191 of a corresponding pixel. The light emission layer 373 may be made of an organic material that uniquely emits light of one of the primary colors, e.g., red, green, and blue, and may have a structure in which a plurality of organic material layers that emit light of different colors are layered. According to exemplary embodiments of the inventive concept, the light emission layer 373 may include a white emission layer. A part of the light emission layer 373 may overlap with the driving transistor Qd.

The second organic common layer 375 may include at least one of an electron transport layer (ETL) and an electron injecting layer (EIL), and when the second organic common layer 375 includes both the electron transport layer (ETL) and the electron injecting layer (EIL), the electron transport layer (ETL) and the electron injecting layer (EIL) may be sequentially layered.

A common electrode 270 that transmits a common voltage is provided on the light emitting member 370. The common electrode 270 is made of a transparent conductive material, or is formed by thinly layering metals, such as calcium (Ca), barium (Ba), magnesium (Mg), aluminum (Al), silver (Ag), or the like, to have a light transmitting property. The common electrode 270 is connected to the common voltage supply line 20 in the peripheral area PA of the display panel 300 and thus receives the common voltage therefrom. The pixel electrode 191, the light emitting member 370, and the common electrode 270 of each pixel PX form a light emission element.

The encapsulation layer 390 is provided above the common electrode 270. The encapsulation layer 390 encapsulates the light emitting member 370 and the common electrode 270 to prevent permeation of moisture or oxygen from the outside. The encapsulation layer 390 may also be provided in the peripheral area. For example, the encapsulation layer 390 may be provided in the peripheral area, excluding portions where the driving circuit chip 400 is attached or mounted. The encapsulation layer 390 may include at least one inorganic layer and at least one organic layer, and the inorganic layers and organic layers may be alternately layered. The encapsulation layer 390 provided in the bending area BA may not include an inorganic layer.

As described above, according to exemplary embodiments of the inventive concept, the resistance of the driving voltage supply wire can be reduced. Therefore, a load effect of the display device can be reduced, to suppress or prevent occurrence of a difference in luminance.

While the inventive concept has been shown and described with reference to exemplary embodiments thereof, it is to be understood by those of ordinary skill in the art that various modifications in form and details may be made thereto without departing from the spirit and scope of the present inventive concept as defined by the following claims.

What is claimed is:
1. A display device comprising:
   a display panel including a display area and a peripheral area;
   a plurality of data lines and a plurality of driving voltage lines provided in the display area;
   a plurality of data connection lines provided in the peripheral area and connected to the plurality of data lines;
   a first driving voltage transmission line provided in the peripheral area and overlapping the plurality of data connection lines;
   a second driving voltage transmission line provided in the peripheral area and disposed between the first driving voltage transmission line and the display area; and
   a plurality of driving voltage connection lines directly connecting the first driving voltage transmission line to the second driving voltage transmission line in the pheripheral area, and provided between the first driving voltage transmission line and the second driving voltage transmission line.

2. The display device of claim 1, wherein the first driving voltage transmission line and the second driving voltage transmission line substantially extend in a first direction, and the plurality of data connection lines and the plurality of driving voltage connection lines substantially extend in a second direction that crosses the first direction.

3. The display device of claim 2, wherein the plurality of data connection lines and the plurality of driving voltage connection lines are alternately arranged one by one along the first direction.

4. The display device of claim 2, wherein at least two data connection lines among the plurality of data connection lines are disposed between a pair of driving voltage connection lines among the plurality of driving voltage connection lines, and
   the pair of driving voltage connection lines are adjacent to each other in the first direction.

5. The display device of claim 4, wherein a line width of each of the driving voltage connection lines is wider than a line width of each of the data connection lines.

6. The display device of claim 1, further comprising:
   a driving voltage supply line provided in the peripheral area and connected to the first driving voltage transmission line; and
   a pad portion provided between the first driving voltage transmission line and an edge of the display panel,
   wherein the driving voltage supply line is connected to the pad portion.

7. The display device of claim 1, wherein the second driving voltage transmission line and the plurality of data connection lines overlap each other.

8. The display device of claim 7, further comprising a plurality of gate lines provided in the display area,
   wherein a portion of the plurality of data connection lines, overlapping the first driving voltage transmission line and the second driving voltage transmission line, is provided in the same layer as the plurality of gate lines.

9. The display device of claim 1, wherein the peripheral area comprises a bending area, and a portion of the plurality of data connection lines, provided in the bending area, is provided in the same layer as the plurality of driving voltage connection lines.

10. The display device of claim 1, wherein the first driving voltage transmission line, the second driving voltage transmission line, and the plurality of driving voltage connection lines are provided in the same layer as the plurality of driving voltage lines.

11. A display device comprising:
a display panel including a display area and a peripheral area;
a plurality of data lines and a plurality of driving voltage lines provided in the display area;
a data driver provided in the peripheral area;
a plurality of data connection lines provided in the peripheral area and connecting the data driver and the plurality of data lines;
a driving voltage supply line provided in the peripheral area;
a first driving voltage transmission line provided between the display area and the data driver and connected to the driving voltage supply line;
a second driving voltage transmission line, provided between the display area and the first driving voltage transmission line, in the peripheral area; and
a plurality of driving voltage connection lines, connected to the first driving voltage transmission line and the second driving voltage transmission line, in the peripheral area,
wherein at least one of the plurality of driving voltage connection lines is provided between the plurality of data connection lines.

12. The display device of claim 11, wherein the first driving voltage transmission line and the second driving voltage transmission line substantially extend in a first direction, and the plurality of data connection lines and the plurality of driving voltage connection lines substantially extend in a second direction that crosses the first direction.

13. The display device of claim 12, wherein the plurality of data connection lines and the plurality of driving voltage connection lines are alternately arranged one by one along the first direction.

14. The display device of claim 12, wherein at least two data connection lines among the plurality of data connection lines are disposed between a pair of driving voltage connection lines among the plurality of driving voltage connection lines, and
the pair of driving voltage connection lines are adjacent to each other in the first direction.

15. The display device of claim 14, wherein a line width of each of the driving voltage connection lines is wider than a line width of each of the data connection lines.

16. A display device comprising:
a display panel including a display area and a peripheral area, wherein the display area includes a plurality of pixels and the peripheral area includes a bending area;
a plurality of data connection lines extending through the bending area;
a first driving voltage transmission line provided in the peripheral area;
a second driving voltage transmission line provided in the peripheral area and disposed between the first driving voltage transmission line and the display area;
a plurality of driving voltage connection lines connecting the first driving voltage transmission line and the second driving voltage transmission line, and disposed alongside the plurality of data connection lines;
a common voltage supply line extending only through a portion of the peripheral area, substantially surrounding the display area, and supplying a common voltage to the plurality of pixels;
a first common voltage transmission line disposed in the peripheral area, in parallel with the first driving voltage transmission line, and connected to the common voltage supply line;
a second common voltage transmission line disposed in the peripheral area and in parallel with the second driving voltage transmission line; and
a plurality of common voltage connection lines connecting the first common voltage transmission line and the second common voltage transmission line, and alternatively disposed alongside the plurality of data connection lines.

17. The display device of claim 16, further comprising:
a plurality of data lines, a plurality of gate lines, and a plurality of driving voltage lines provided in the display area,
wherein the plurality of data connection lines is connected to the plurality of data lines,
a first and a second portion of the plurality of data connection lines, overlapping the first driving voltage transmission line and the second driving voltage transmission line, respectively, are provided in the same layer as the plurality of gate lines, and
a third portion of the plurality of data connection lines, provided in the bending area, is provided in the same layer as the plurality of driving voltage connection lines.

18. The display device of claim 17, wherein a width of the first portion of the plurality of data connection lines or the second portion of the plurality of data connection lines is greater than a width of the third portion of the plurality of data connection lines.

19. The display device of claim 17, wherein
the first portion of the plurality of data connection lines and the second portion of the plurality of data connection lines have higher resistivity than the third portion of the plurality of data connection lines.

20. The display device of claim 19, wherein
the first portion of the plurality of data connection lines and the second portion of the plurality of data connection lines are made of a molybdenum-based metal, and
the third portion of the plurality of data connection lines is made of an aluminum-based metal.

* * * * *